(12) United States Patent
Teeny et al.

(10) Patent No.: US 6,418,584 B1
(45) Date of Patent: Jul. 16, 2002

(54) APPARATUS AND PROCESS FOR CLEANING A WORK PIECE

(75) Inventors: Ned Teeny, Chandler; Glenn E. Peterson, Peoria, both of AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/577,448

(22) Filed: May 24, 2000

(51) Int. Cl.[7] ............................. B08B 1/04; B08B 7/04; H01L 21/304

(52) U.S. Cl. .............................................. 15/102; 15/77

(58) Field of Search .......................... 15/77, 88.2, 88.3, 15/102, 265.5

(56) References Cited

U.S. PATENT DOCUMENTS

| | | | |
|---|---|---|---|
| 4,476,601 A | | 10/1984 | Oka |
| 5,647,083 A | * | 7/1997 | Sugimoto et al. |
| 5,682,638 A | | 11/1997 | Kaiser |
| 5,685,039 A | * | 11/1997 | Hamada et al. |
| 5,870,793 A | | 2/1999 | Choffat et al. |
| 5,894,622 A | * | 4/1999 | Manfredi et al. |
| 5,950,327 A | | 9/1999 | Peterson et al. |

FOREIGN PATENT DOCUMENTS

| | | |
|---|---|---|
| EP | 0764478 | 3/1997 |
| EP | 0893819 | 1/1999 |
| JP | 9-266187 | * 10/1997 |
| JP | 10-106995 | * 4/1998 |

* cited by examiner

Primary Examiner—Terrence R. Till
(74) Attorney, Agent, or Firm—James L. Farmer

(57) ABSTRACT

Apparatus and process for cleaning the surface of a work piece include a first cleaning station for scrubbing a work piece and a second cleaning station for cleaning the pad used to scrub the surface of the work piece. The pad is cleaned during the "dead time" during which a first clean work pieces is unloaded and a subsequent dirty work piece is loaded into the first cleaning station. During the dead time the cleaning pad, mounted on a support stand that controls the cleaning pad, pivots from the first work piece cleaning station to the second pad cleaning station. The cleaning pad is lowered into the pad cleaning station and is brought into contact with a beater bar against which the pad surface is rotated. During the rotation the pad surface is washed with a cleaning fluid of the same composition as used to clean the work piece surface. By using the same composition, the cleaning pad remains saturated with the cleaning fluid and each subsequently cleaned work piece experiences the same cleaning environment. Rotating the cleaning pad against the beater bar in the presence of the cleaning fluid removes particulates that might otherwise scratch or contaminate a subsequently cleaned work piece. Following cleaning of the cleaning pad, the pad pivots back to a position over a work piece positioned in the first work piece cleaning station. Because the pad was cleaned with the same composition used to clean a work piece, controlled cleaning of a work piece can begin immediately without waiting for the cleaning fluid on the pad to reach the right composition.

20 Claims, 8 Drawing Sheets

APPARATUS AND PROCESS FOR CLEANING A WORK PIECE

FIELD OF THE INVENTION

This invention relates generally to an apparatus and to a process for cleaning a work piece, and more specifically, in one embodiment, relates to an apparatus and to a process for cleaning a plurality of work pieces and to efficiently maintaining the cleanliness of a scrubbing pad used in the process.

BACKGROUND OF THE INVENTION

This invention relates to the processing of objects that are generally in the shape of flat, circular disks. Such objects include, for example, semiconductor wafers, compact disks, memory disks, optical blanks, and the like. Without loss of generality, such objects will be referred to as "work pieces." Illustrative examples will refer specifically to the use of this invention in connection with the processing of semiconductor wafers, but such examples are presented merely to aid in understanding, and are not intended to limit in any way the generality or application of the invention.

During the fabrication of a work piece, the work piece may be subjected to various processing steps. In the case of fabricating a semiconductor wafer, those process steps may involve the growth or deposition of insulating layers, the deposition of metal or other conductive layers, impurity doping, photolithographic patterning, planarization, and the like. The fabrication of such semiconductor wafers, like the fabrication of many other types of work pieces, requires extreme cleanliness of the wafer at various stages of the process. Accordingly, the above process steps are often preceded or followed by cleaning steps to insure that the requisite cleanliness is maintained.

Wafer cleaning, especially following a planarization step such as a chemical-mechanical planarization (CMP) process, often involves the scrubbing of the wafer surface with a cleaning pad, sponge, or brush. The scrubbing removes particulates, residue, and contaminates remaining on the wafer surface after the CMP process. A pad, generally in the form of a flat, circular pad, or a brush, generally in the form of a cylindrical roller, is often formed from a spongy material such as poly vinyl alcohol (PVA) or similar material. Although described above as "flat" or "cylindrical," the pads or brushes may have bumps, ridges, or other projections on their surfaces to aid in the cleaning process. For ease of discussion, all such cleaning pads, sponges, and brushes will be referred to herein as "pads," and the term shall be intended to include all such cleaning implements regardless of shape or material of construction.

For obvious reasons of economy, fabrication processes are usually designed for speed and efficiency. To achieve such speed and efficiency, it is desirable to process wafers serially, one after another, in an almost continuous and unending manner. The wafer cleaning steps should, preferably, lend themselves to such an efficient and continuous process. After the scrubbing of a wafer, especially following a CMP process, particulates are often found on or embedded in the surface of the pad. If not removed, these particulates can damage the surface of subsequent wafers when those subsequent wafers are scrubbed with the same pad. Semiconductor wafers are processed to fabricate device structures having extremely fine detail. Any scratching of such a device structure can cause the device to fail, resulting in a decrease in yield on the wafer and a decrease in the value of the wafer. Accordingly, it is clear that such damage to the surface of subsequent wafers is not acceptable. Present cleaning apparatus and processes have not been able to provide an efficient and speedy means to clean wafers without interrupting the almost continuous flow of wafers through the process.

A need therefore exists for a work piece cleaning process and apparatus that avoids damage to the surface of the work pieces being cleaned and that can be integrated into the overall work piece fabrication process. The work piece cleaning apparatus and process should preferably provide for cleaning of the cleaning pads on a regular basis without interrupting the cleaning of a plurality of work pieces.

BRIEF DESCRIPTION OF THE DRAWINGS

The present invention will hereinafter be describes in conjunction with the appended drawing figures in which like numerals generally denote like elements, and in which.

DETAILED DESCRIPTION OF PREFERRED EXEMPLARY EMBODIMENTS

As will be more fully explained below, this invention relates to apparatus and process for cleaning a work piece, and preferably to efficiently cleaning a plurality of work pieces. The apparatus is configured to provide alternatively for the scrubbing of a work piece and then for the cleaning of the pad used to clean the work piece. By cleaning the pad, contaminants, and especially particulates, from one work piece do not impact the cleaning of a subsequent work piece.

Figure 1:
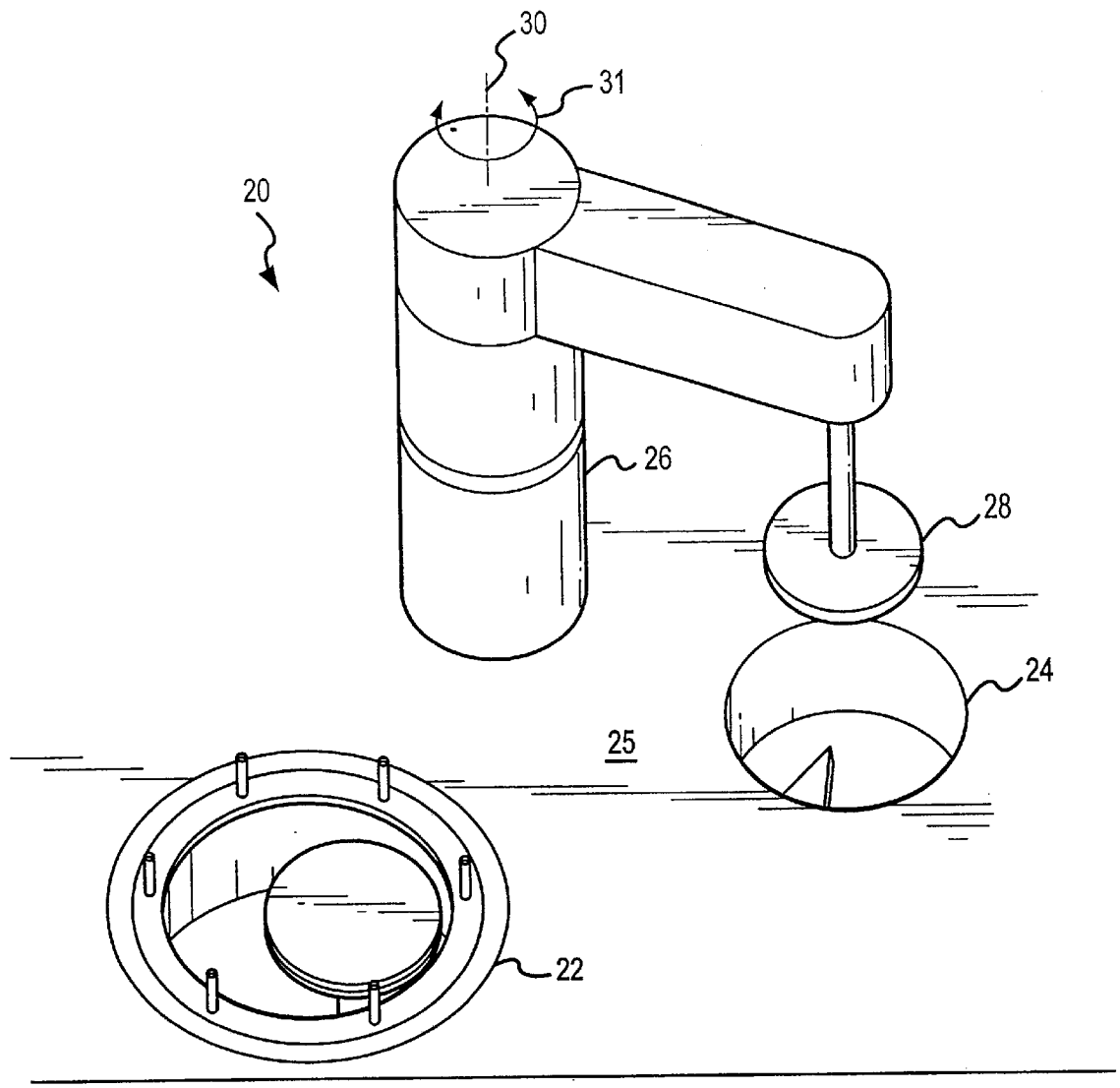
FIG. 1 illustrates schematically, in perspective view, a work piece cleaning apparatus in accordance with one embodiment of the invention.

FIG. 1 illustrates schematically, in perspective view, a work piece cleaning apparatus 20 in accordance with one embodiment of the invention. The apparatus includes a work piece cleaning station 22 and a pad cleaning station 24. The work piece cleaning station and the pad cleaning station can be located on or recessed in a work surface 25. A support stand 26 controls the motion of an upper cleaning pad 28. The support stand is configured to pivot about an axis 30 in the direction indicated by double headed arrow 31 to selectively position the pad over either the work piece cleaning station or the pad cleaning station. When positioned over the work piece cleaning station, the upper cleaning pad can be used in the cleaning of one surface of a work piece. When positioned over the pad cleaning station, the pad itself can be cleaned. The cleaning of the work piece and the cleaning of the pad, both parts of a work piece cleaning process in accordance with one embodiment of the invention, is explained in more detail below.

Figure 2:
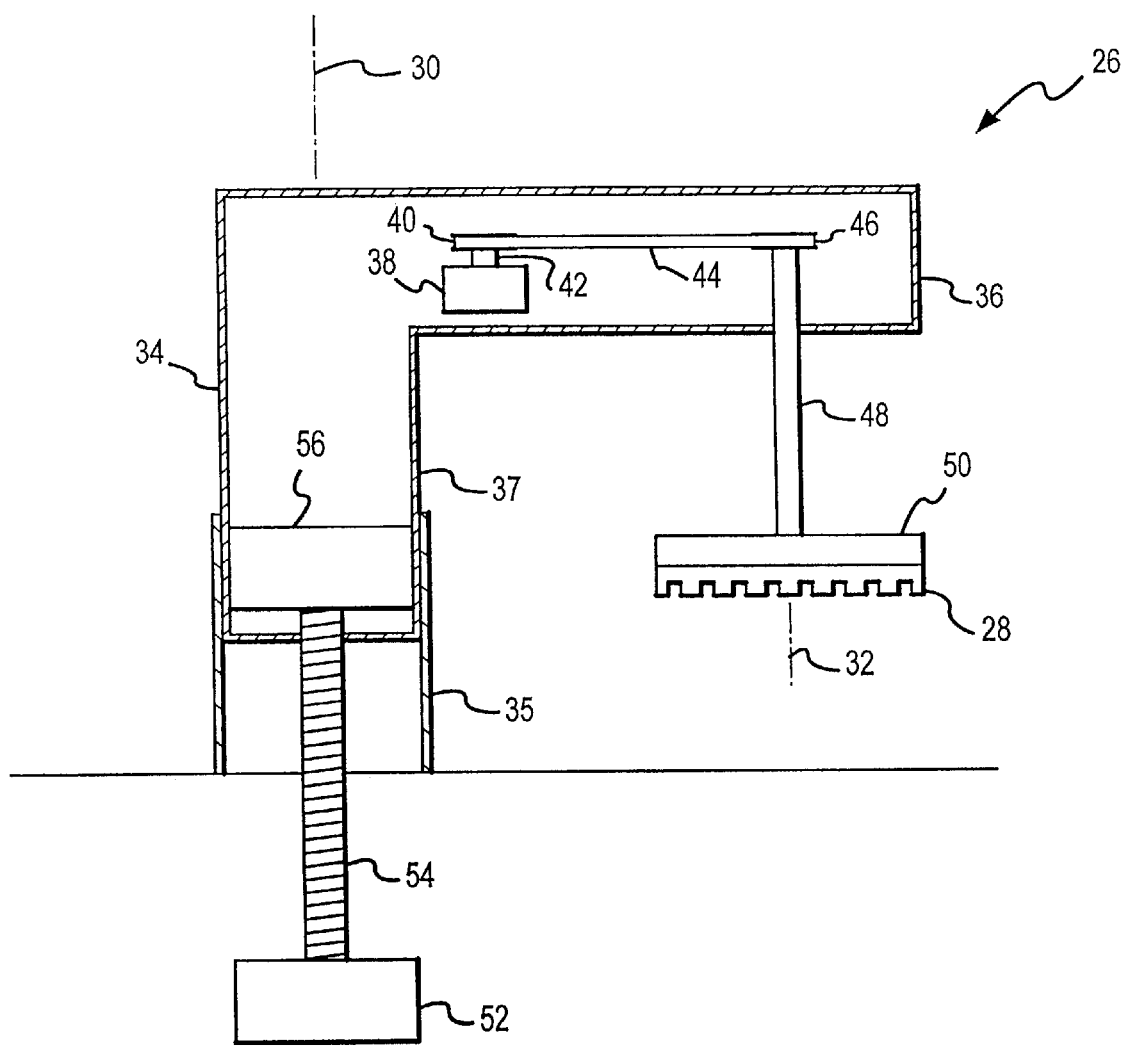
FIG. 2 illustrates, in cross section, an embodiment of a cleaning pad support stand.

FIG. 2 illustrates, in cross section, one embodiment of support stand 26. In addition to the pivoting motion about axis 30, the support stand is configured to impart a rotary motion to upper cleaning pad 28 about axis 32. The support stand also controls the vertical movement of upper cleaning pad 28. Support stand 26 includes a vertical support post 34 with fixed 35 and movable 37 telescoping portions and a horizontal arm 36. FIG. 2 illustrates just one of the many ways in which the various motions of a cleaning pad can be effected and controlled. Those of skill in the art will appreciate that there are many other mechanical implementations to accomplish the same results. In accordance with one embodiment, a motor 38 is built into horizontal arm 36. A motor pulley 40 is coupled to motor shaft 42 and a drive belt 44 extends from motor pulley 40 to a pad shaft pulley 46 mounted on pad shaft 48. An upper pad carrier 50 is coupled to pad shaft 48 and an upper cleaning pad 28 is mounted on upper pad carrier 50. A controller (not illustrated) is coupled to and controls motor 38 and thus controls the rotary motion of pad 28 during the cleaning process.

A second motor 52 controls the height of horizontal arm 36 and thus the height of the upper cleaning pad. Motor 52, for example, can be a servomotor coupled to a screw shaft 54 threaded into a block 56 that is coupled rigidly to movable portion 37 of vertical support post 34. A controller (not illustrated) coupled to motor 52 controls the rotation of motor 52 and screw shaft 54 to control the height of upper cleaning pad 28. Motor 52 and screw shaft 54 can also be used to control the pivoting of support stand 26. Support stand 26 can be made to pivot by selectively locking screw shaft 54 to block 56 so that the block, and thus the movable portion of the vertical support post, pivots as the servomotor turns. Again, a controller can be used to control whether the screw shaft threads into block 56 causing the height of the upper cleaning pad to change or is locked to the block causing the pad and its carrier to pivot. The controllers referenced herein can be, for example, a microprocessor, microcontroller, computer, or the like. A single controller can be used to control all functions, or separate controllers can be used to control separate functions. Motor 52 can be located beneath work surface 25. The fixed portion of vertical support post 34 can be mounted to the top surface of work surface 25.

Figure 3:
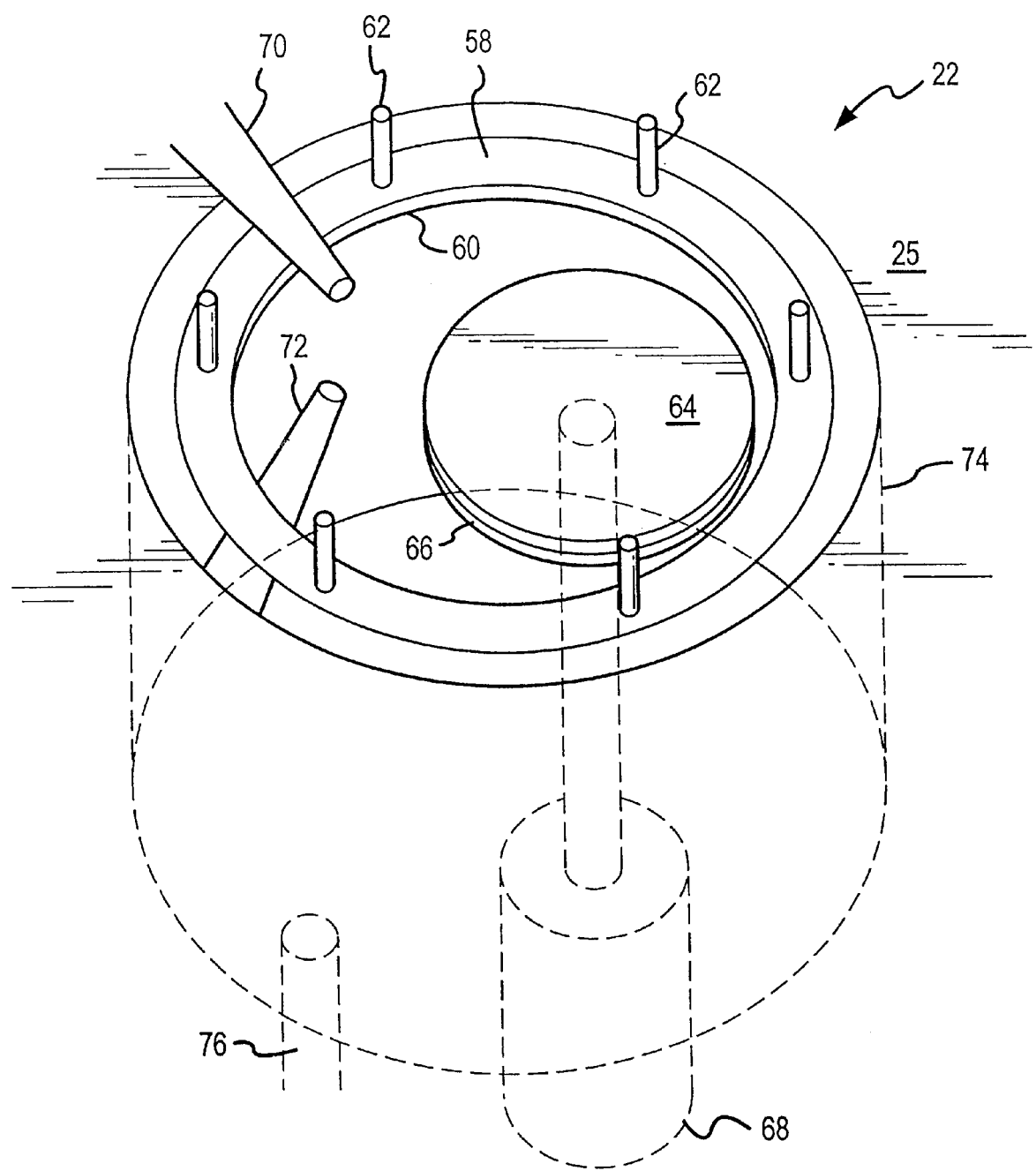
FIG. 3 illustrates, in perspective view, one embodiment of a work piece cleaning station.

FIG. 3 illustrates, in perspective view, one embodiment of work piece cleaning station 22 in more detail. In accordance with one embodiment of the invention, the cleaning station includes a roller ring 58 that supports and positions a work piece prior to cleaning and centers the work piece during cleaning. The roller ring can be a thin toroidal ring 60 with a plurality of guide posts 62 spaced evenly about its periphery. Preferably the roller ring includes 5 or 6 such guide posts. The guide posts are positioned in a circular pattern with the circumference of the circular pattern slightly greater than the diameter of the anticipated work piece. For example, for a work piece having a diameter of 200 millimeters (mm) the guide posts are preferably positioned on a circle having a diameter of about 202–205 mm. To initiate the cleaning process a work piece (not illustrated in this figure) is placed on the roller ring and is centered thereon by the guide posts. The work piece is placed on the roller ring with the front or more critical side facing up. For example, if the work piece is a semiconductor wafer, the side of the wafer on which the interconnect metallization of the semiconductor devices is formed or is to be formed is positioned facing upwardly away from toroidal ring 60. The thickness of the toroidal ring in the radial dimension is made small so that only the extreme outer edge of the work piece surface rests on the ring. For example, the ring can have a thickness in the radial dimension of about 1–3 cm. The thickness in the vertical dimension can be whatever thickness is necessary to impart rigidity to the ring. The guide posts can be attached to the toroidal ring by screws or other fasteners, or the posts can be threaded to screw into threaded holes in the ring.

A lower cleaning pad 64, supported by a lower pad carrier 66, is positioned below roller ring 58 and within the circumference of the roller ring. The lower cleaning pad will clean the lower or back side of the work piece. The lower cleaning pad has a diameter less than the diameter of the roller ring, but greater than half the diameter of the roller ring. Preferably the upper and lower cleaning pads have the same diameter. In accordance with one embodiment of the invention, for cleaning a semiconductor wafer having a diameter of about 200 mm, the two cleaning pads can have a diameter of about 125 mm. The center of lower cleaning pad 64 is offset from the center of the roller ring so that the edge of the cleaning pad extends at least to and preferably beyond the edge of the work piece. Pad carrier 66 is coupled to the drive shaft of a lower cleaning pad drive motor 68 that is configured to impart both a vertical motion and a rotary motion to lower cleaning pad 64.

Work piece cleaning station 22 also includes spray cleaning nozzles 70 and 72 that are configured to spray selected cleaning fluids on the top and bottom surfaces, respectively, of a work piece during the cleaning process. Although only two cleaning nozzles are illustrated, more nozzles can also be used, as needed, to either provide a better distribution of cleaning fluids or to direct other or additional cleaning fluids onto the work piece surfaces. A receptacle 74, recessed into work surface 25, provides for collection of used and excess cleaning fluids and for the collection of residue removed from the surfaces of the work piece. A drain 76 removes the collected material from the receptacle. Those portions of the work piece cleaning station that are positioned below work surface 25 and that would not be visible below the work surface are shown with dashed lines. Although not illustrated in the figure, suitable shielding may be provided around the cleaning station to contain the cleaning fluids and to protect workers or other equipment from contact with these fluids. Again, those of skill in the art will appreciate that there are many other possible mechanical implementations of the work piece cleaning station that can achieve the same or similar result.

Figure 4:
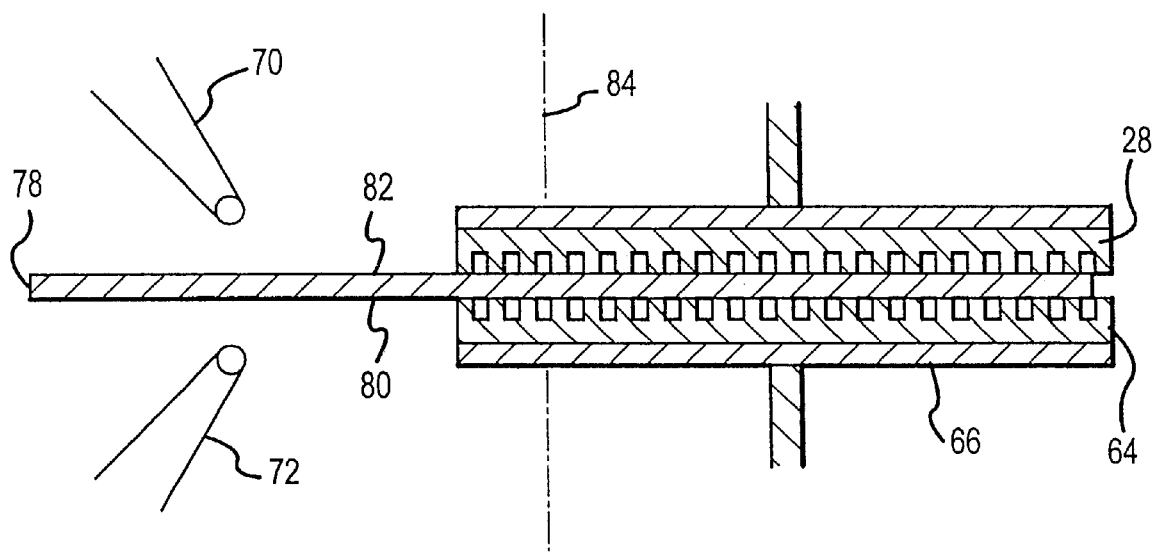
FIG. 4 illustrates, in cross section, the cleaning of a work piece in accordance with one embodiment of the invention.

FIG. 4 illustrates, in cross section, the cleaning of a work piece 78 in accordance with one embodiment of the invention. This figure illustrates how elements of the work piece cleaning station cooperate with the cleaning pad support stand system to accomplish work piece cleaning. After a work piece is centered on the roller ring in the work piece cleaning station, lower drive pad motor 68 raises lower cleaning pad carrier 66 and lower cleaning pad 64 to cause the cleaning pad to contact bottom surface 80 of work piece 78 and to lift work piece 78 out of contact with toroidal ring 60 (not shown in this illustration). Simultaneously, motor 52 causes upper cleaning pad 28 to be lowered to a position at which the pad contacts upper surface 82 of work piece 78. The work piece is thus sandwiched between and supported by the upper and lower cleaning pads. Motors 38 and 68 can then be activated to control the rotation of the upper and lower cleaning pads, respectively. The rotating upper and lower brushes scrub upper surface 82 and lower surface 80, respectively, of work piece 78. By controlling the rotational speeds of the two brushes, the work piece can also be made to rotate controllably about an axis 84. For example, motor 38 can be controlled to cause upper cleaning pad 28 to rotate at one rotation rate and motor 68 can be controlled to cause lower cleaning pad 64 to rotate at a different rotation rate. For example, in one embodiment, pad 28 can be made to rotate at about 100 revolutions per minute (rpm) and pad 64 can be made to rotate at about 500 rpm. The two different rotation rates combine to cause the work piece to rotate at the same time that the two pads are scrubbing the two surfaces of the work piece. As the two pads are scrubbing the surfaces of the work piece, cleaning nozzles 70 and 72 can spray cleaning fluids onto the upper and lower surfaces of the work piece. Scrubbing in the presence of the cleaning fluids removes contaminants, particulates, or other residue from previous processing steps from the work piece surfaces. Depending on the cleaning process being implemented and the residue to be removed from the surfaces, the cleaning fluids can include, for example, deionized (DI) water, dilute ammonium hydroxide, dilute hydrofluoric acid, buffered hydrofluoric acid, solvents, surfactants, detergents, and the like.

Figure 5:
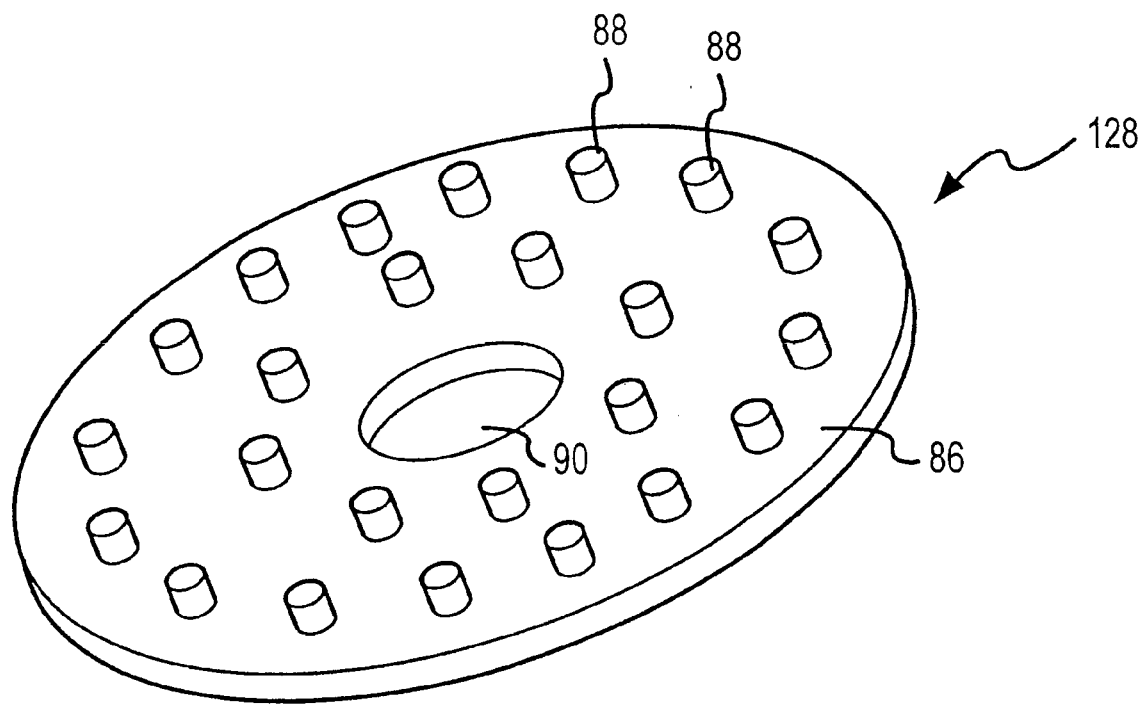
FIG. 5 illustrates, in perspective view, one example of a cleaning pad.

FIG. 5 illustrates, in perspective view, one example of a cleaning pad 128 that can be employed in the cleaning apparatus and process just described. The cleaning pad is a substantially circular piece of material having a substantially planar surface 86 from which a plurality of protrusions 88 extend. The protrusions on the work piece cleaning surface of the pad aid in the scrubbing of the work piece surface. The particular pattern of protrusions can be selected depending on the cleaning process being implemented and on the particular type of work piece being cleaned. A hole 90 in the center of the pad provides for attachment of the pad to a carrier 50. Preferably the pad is formed of a spongy material that is non-contaminating to the cleaning process. Accordingly, the material should be free from contaminants and should not adversely react with the cleaning fluids used in the cleaning process. Pads can be made, for example, from microcellular poly vinyl alcohol (PVA) available from Cupps Industrial Supply, Inc. of Phoenix, Ariz. Other types of pads can also be employed depending on the application. For example, the pad can be formed of spongy materials other than PVA, or the pad can be brush-like with bristles extending outwardly from a base member. Other pad designs and structures will be apparent to those of skill in the cleaning art. Although not illustrated, one alternate cleaning pad configuration is mounted to a cleaning pad carrier by stretching a porous elastic cleaning pad material over the substantially flat surface of the carrier and extending over the sides of the carrier. Such a cleaning pad configuration is illustrated in U.S. Pat. No. 5,870,793, the disclosure of which is incorporated herein by reference.

As work pieces are cleaned using a cleaning pad such as pad 128 illustrated in FIG. 5, the pad becomes saturated with the cleaning fluid that is sprayed on the surface of the work pieces. The saturated nature of the cleaning pad is a factor in developing, implementing, and maintaining a uniform and continuous process. As part of a continuous cleaning process in which work pieces are cleaned serially, one after another, the saturated pad becomes a process constant; each wafer is cleaned under the same conditions. As a work piece is cleaned, however, the cleaning pad also becomes contaminated with the residue being removed from the work piece surface. Particulates may also become attached to or embedded in the pad surface. If left on the pad, the contaminates and/or particulates may contaminate or damage a subsequently cleaned work piece. In accordance with an embodiment of this invention, such contaminants and/or particulates are removed from the cleaning pad without significantly changing the saturated condition of the cleaning pad.

Figure 6:
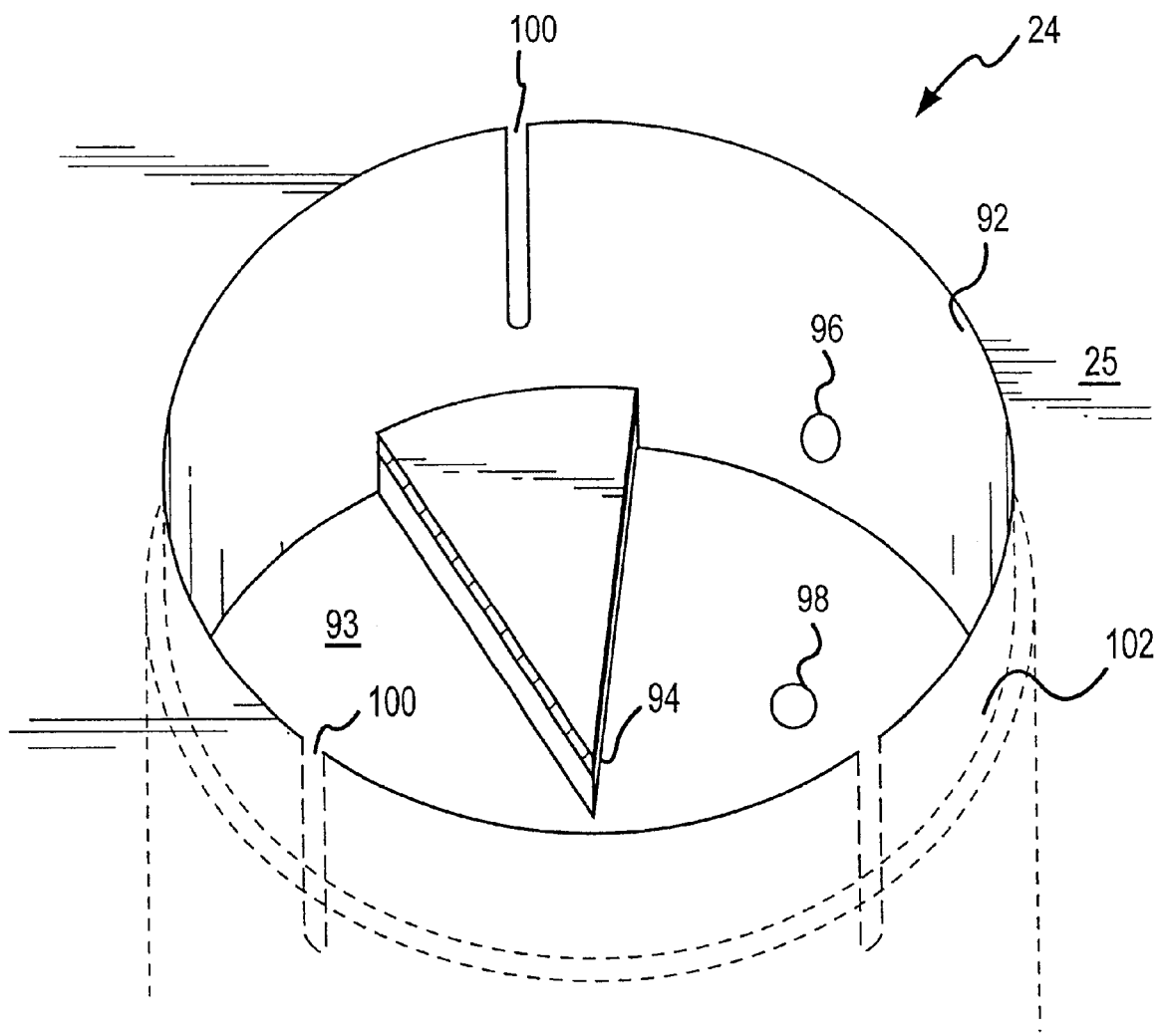
FIG. 6 illustrates, in perspective view, a pad cleaning station in accordance with an embodiment of the invention.

FIG. 6 illustrates, in perspective view, a pad cleaning station 24 in accordance with an embodiment of the invention. Pad cleaning station 24 is positioned adjacent to but spaced apart from work piece cleaning station 22, preferably on a single work surface 25. The spacing between the pad cleaning station and the work piece cleaning station is set to allow the support stand to pivot from a setting that positions the cleaning pad first over the work piece cleaning station and then to a setting that positions the cleaning pad over the pad cleaning station.

In this embodiment pad cleaning station 24 includes a concave shaped container 92 having a beater bar 94 positioned on the interior bottom of the container. Preferably container 92 is recessed into work surface 25. The cleaning station also includes an orifice 96 through which fresh cleaning fluids can be supplied to the interior of the container and an orifice 98 through which used cleaning fluids can be removed from the container. Orifice 96 can be located on a side of container 92 or (not illustrated) can be one or more injectors that spray cleaning fluid into the container or onto the pad to be cleaned. In one embodiment of the invention the cleaning station also includes one or more overflow openings 100 in the edge of container 92 to aid in controlling the amount of cleaning fluid in the container. Preferably the cleaning station includes three or four overflow openings 100 spaced about the periphery of the container edge. Overflow openings 100 open into a drain 102 from which the excess cleaning fluid can be removed to a storage or disposal system. Orifice 98 can be connected to the same storage or disposal system. In one embodiment, a screen (not illustrated) is placed over orifice 98 to prevent large particulates from passing through the orifice where they might clog or restrict the flow of fluids through the tubing or piping that extends from the orifice to the storage or disposal system. Again, portions of the pad cleaning station that would not be seen because of their location below work surface 25 are shown in dashed lines.

In a preferred embodiment, container 92 has a substantially circular interior shape having a diameter about 0.5 to about 2.0 centimeters (cm) greater and preferably about 1 cm greater than the diameter of the cleaning pad used in the work piece cleaning process. Beater bar 94, which can have various configurations as discussed more fully below, is a structure upstanding from the bottom of the interior of container 92. In one embodiment the beater bar has a length greater than one half the diameter of container 92, but less than the entire diameter of the container.

The beater bar illustrated in FIG. 6 is a generally solid structure attached to and upstanding from bottom or base 93 of container 92. Beater bar 94 has a triangular shape with the leading edge of the triangle being greater than one half the interior diameter of container 92. The edges of the triangular beater bar are slightly rounded or relieved to reduce damage to the cleaning pad as the cleaning pad brushes against the beater bar in the pad cleaning process as explained more fully below. In this embodiment overflow openings 100 are positioned about 5 mm above the top of beater bar 94 so that, during a cleaning pad cleaning operation the beater bar can be immersed in the in the cleaning fluid.

Figure 7:
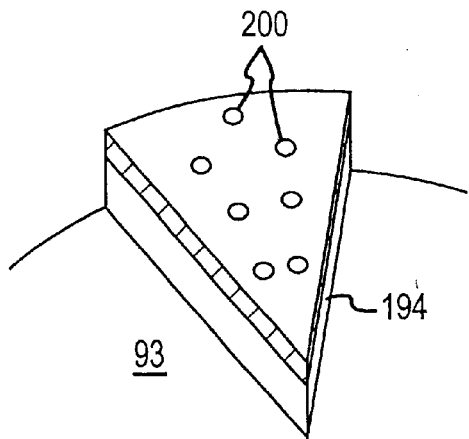
FIGS. 7–9 illustrate, in perspective view, beater bars in accordance with various embodiments of the invention.
Figure 8:
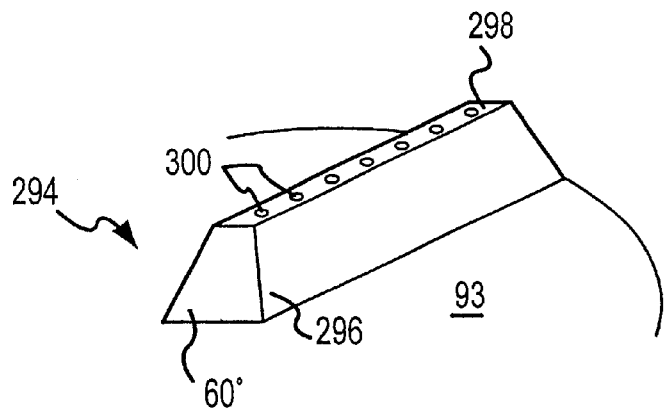
Figure 9:
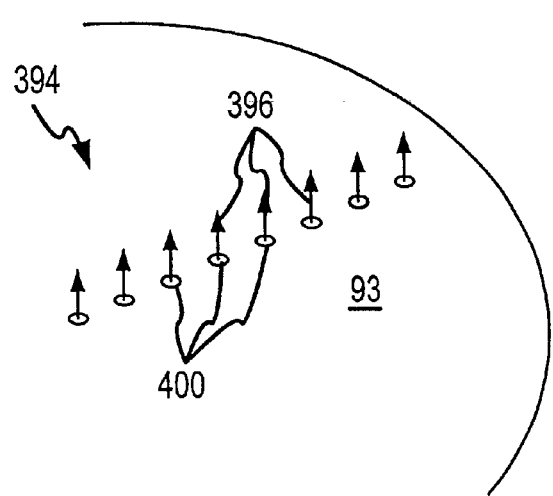

Various alternate embodiments of the beater bar are illustrated in FIGS. 7–9. FIG. 7 illustrates a beater bar 194 having the same triangular shape as previously illustrated beater bar 94. In addition, beater bar 194 also includes a plurality of apertures 200 through which cleaning fluid can be ejected onto the surface of a cleaning pad during the cleaning of that pad. FIG. 8 illustrates a beater bar 294 having a rectangular base and a regular trapezoidal cross section. In one embodiment sides 296 can slope from base 93 of container 92 at an angle of about 60 degrees and top 298 can have a width of about 1.5 mm. Optionally, top 298 can be provided with a plurality of apertures 300 through which cleaning fluid can be ejected. In an alternate embodiment (not illustrated) the plurality of apertures can be replaced by a single narrow slit aperture. FIG. 9 illustrates yet another form of beater bar 394. Instead of a solid structure, beater bar 394 is a liquid knife that is formed by a fluid shower or a plurality of jets 396 of cleaning fluid ejected forcefully from a plurality of apertures 400 formed in base 93 of container 92. The liquid knife provides a powerful stream of cleaning fluid to impinge on the surface of a cleaning pad rotated through the liquid knife.

Figure 10:
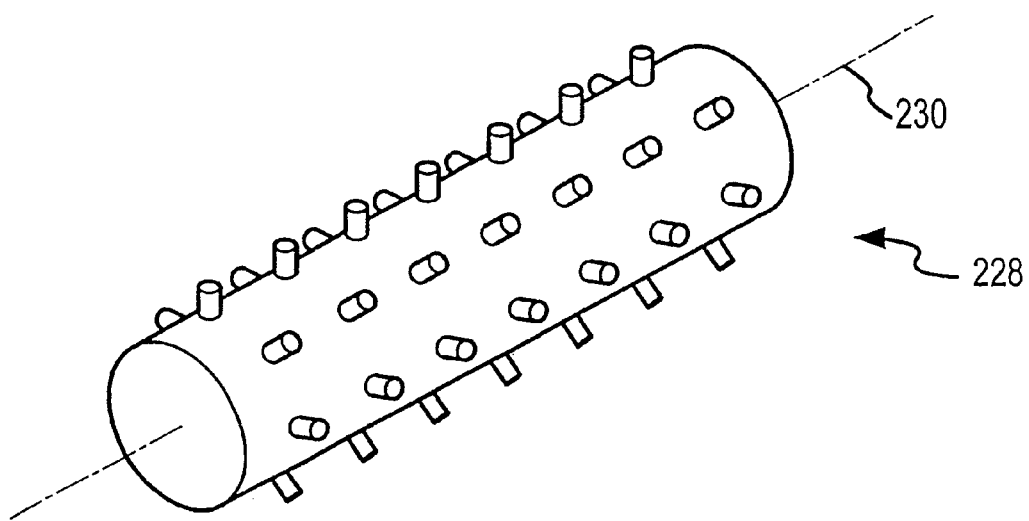
FIG. 10 illustrates, in perspective view, one embodiment of a cleaning roller pad.

Cleaning pads often take other forms than the substantially flat circular pads described above. For example, roller boxes or brush boxes using cylindrical shaped cleaning pads are often used as a work piece cleaning station to clean work piece surfaces. Such a brush box and its use in cleaning work pieces is described and illustrated, for example, in U.S. Pat. No. 5,950,327 the disclosure of which is incorporated herein by reference. A brush box includes a plurality of pairs of brushes or rollers through which a work piece passes. Some of the pairs of rollers serve to move the work piece through the brush box while other pairs of rollers serve as cleaning pads to scrub the surfaces of the work piece as it passes through the box. Cleaning fluids are sprayed on the work piece surfaces and on the rollers as the cleaning pads scrub the work piece surfaces. FIG. 10 illustrates, in perspective view, one exemplary cleaning roller pad 228. In accordance with one embodiment of the invention, the cleaning roller pad is made of a spongy material such as PVA. The cleaning roller pad rotates about an axis 230. Those of skill in the art will appreciate that the pattern of protuberances on the surface of cleaning roller pad 228 and the material from which the pad is formed can be varied, depending on the particular type of work piece being cleaned.

Figure 11:
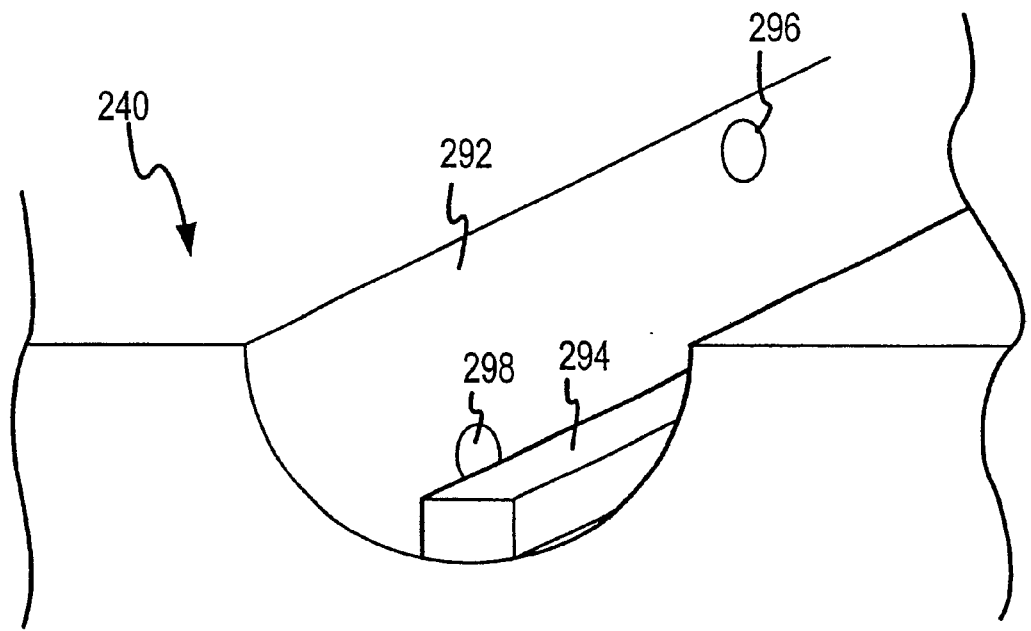
FIG. 11 illustrates, in perspective view, an alternate embodiment of a pad cleaning station.

In accordance with one embodiment of the invention, a cleaning roller pad such as cleaning roller pad 228 is used to scrub the surface of a work piece and then is moved to a roller pad cleaning station 240 as illustrated in FIG. 11. Cleaning station 240 includes a container 292 having an elongate convex shape to accommodate the shape of the roller pad. The container includes a beater bar 294 that extends along the interior bottom of the container and that has a length greater than the length of the roller pad. The container also includes an inlet orifice 296 and an outlet orifice 298 through which a cleaning fluid can be injected and used cleaning fluid can be removed, respectively. To clean a cleaning roller pad 228, the pad is made to rotate about axis 230 with the pad surface in contact with beater bar 294 in the presence of a cleaning fluid of substantially the same composition as the cleaning fluid used to clean work pieces.

Although not illustrated in any of the figures, in accordance with one embodiment of the invention, cleaning fluids can be supplied to the work piece cleaning station and to the pad cleaning station from a single cleaning fluid supply or reservoir. The start and termination of the flow of cleaning fluids to the two cleaning stations can be controlled by a controller as part of the overall work piece cleaning process. Similarly, in accordance with one embodiment of the invention, used cleaning fluids from the two cleaning stations can be collected in the same storage or disposal system.

The following non-limiting example will illustrate a process, in accordance with one embodiment of the invention, for cleaning a plurality of semiconductor wafers in an apparatus such as that illustrated in FIG. 1. A similar process is applicable to other work pieces. The wafers to be cleaned can be, for example, 200 mm silicon wafers that have just undergone a CMP process. The wafers are conveyed to the work piece cleaning apparatus directly from the CMP process in a "wet cassette" that keeps the surfaces of the wafers wet until they can be properly cleaned. Keeping the wafers wet prevents the residue from the CMP process from drying on the wafer surfaces. In a preferred process all wafer handling is done robotically, although the wafers can also be transferred manually.

To initiate the wafer cleaning process the first wafer from the wet cassette is transferred to roller ring 58 of work piece cleaning station 22. The wafer is centered on the roller ring by the plurality of guide posts 62 arrayed around the periphery of toroidal ring 60. The wafer is placed on the roller ring with the front or critical side facing upwardly. Support stand 26 pivots to position upper cleaning pad 28 over the surface of the wafer. Lower cleaning pad 64 is positioned below the wafer. The lower cleaning pad is raised to contact and lift the wafer; the upper cleaning pad is lowered to contact the upper surface of the wafer. The upper and lower cleaning pads together hold the wafer in a position slightly above the surface of the toroidal ring. Servomotor 52 is controlled to control vertical position of the upper cleaning pad and thus the pressure exerted on the wafer by the two cleaning pads during the cleaning process. Cleaning nozzles 70 and 72 spray a cleaning fluid onto the upper and lower surfaces of the wafer. The composition of the cleaning fluid is selected depending on the previous process undergone by the wafer and the nature of the material that must be removed from the wafer surfaces. The cleaning fluid can be, for example, a mixture of DI water and hydrofluoric acid. The upper and lower cleaning pads are set in rotational motion by their respective rotational drive motors. The rotational speeds of the two cleaning pads are controlled by a programmed controller. The upper cleaning pad can be set to rotate, for example, at 100 rpm. The lower cleaning pad can be set to rotate at a second rotational speed such as 500 rpm. The rotational speeds of the two cleaning pads can be set at any desired value to achieve the desired cleaning result. By using two different rotational speeds the wafer can be made to rotate within the circumference defined by the guide posts on roller ring 58. As the wafer rotates, both cleaning pads become saturated with the cleaning fluid and both surfaces of the wafer are scrubbed by the cleaning pads.

After a predetermined period of scrubbing, the fluid flow from the cleaning nozzles is terminated, the rotation of the cleaning pads is terminated, and motor 52 is activated to raise the upper cleaning pad to a position above the surface of the wafer. The lower cleaning pad is also returned to a position below the roller ring. Motor 52 is further activated to cause support stand 26 to pivot, placing the upper cleaning pad in a position over pad cleaning station 24.

The upper cleaning pad is cleaned at the pad cleaning station to remove any contaminates or particulates that may have accumulated on the pad surface during the cleaning of the surface of the semiconductor wafer. Servomotor 52 is again activated to lower the upper cleaning pad into container 92 and into contact with beater bar 94. Cleaning fluid of substantially the same composition as used to clean the surfaces of the wafer is injected into the container through inlet orifice 96. For example, if the wafer surface is cleaned with a DI water/hydrofluoric acid cleaning fluid mixture, the same mixture is used to clean the cleaning pad. With the pad in contact with the beater bar and with the container filled with the cleaning fluid mixture, motor 38 is activated to cause the rotation of the cleaning pad against the beater bar. As the pad surface moves against the beater bar in the presence of the cleaning fluid, contaminants and particulates in an on the surface of the pad are removed. Fresh cleaning fluid is injected into the container through inlet orifice 96 and used cleaning fluid is removed from the container through outlet orifice 98 to maintain a supply of fresh, clean cleaning fluid in the container. The height of the cleaning fluid in container 92 is controlled by controlling the rate of fluid ingress through inlet orifice 96, the egress of fluid through outlet orifice 98 and by the presence of overflow openings 100.

During the time the cleaning pad is being cleaned at the pad cleaning station, the first cleaned wafer is removed from the roller ring and is transported to a location for a subsequent cleaning step. For example, the wafer may be transported to a rinse station. Preferably the moving of the first cleaned wafer is done robotically. After the first cleaned wafer is removed from roller ring 58 and transported to another location, a second wafer from the wet cassette is transferred to the roller ring. Servomotor 52 is then again activated to raise the cleaning pad from the cleaning station and to pivot support stand 26 to return the cleaning pad to a location over the work piece cleaning station. The cleaning process can then be repeated with the second wafer as with the previous wafer. Little extra time is added to the total wafer cleaning process by the pad cleaning process because the pad cleaning is done during the time otherwise needed for wafer transport. Although different cleaning fluids can be used for cleaning the cleaning pad and for cleaning the work pieces, it has been found that by using the same cleaning fluid mixture to clean both the wafer and the cleaning pad, saturation of the cleaning pad with that mixture is maintained. After the process has been initiated, the cleaning pad becomes saturated with the cleaning fluid and it remains saturated wafer after wafer. Each wafer is thus exposed to the same cleaning environment, and a uniform cleaning process is maintained, wafer after wafer. In contrast, it has been found that if the cleaning pad is cleaned, for example, in pure DI water, cleaning of the next wafer is difficult to control accurately. That next wafer may be subjected to a cleaning fluid of indeterminant concentration because the cleaning pad is initially saturated with DI water from the pad cleaning operation and then slowly becomes saturated with the cleaning fluid mixture as the work piece cleaning process progresses. It has also been found that cleaning of the top cleaning pad is more important than cleaning of the bottom cleaning pad because only the top cleaning pad contacts the top surface of the wafer, the surface on which critical device structures are formed.

The components of the work piece cleaning station and the pad cleaning station, such as the roller ring, guide posts, cleaning fluid receptacles, the pad cleaning station container and beater bar can be fabricated from any rigid material that is resistant to the cleaning fluid chemicals and that will not contaminate the work pieces being cleaned. For example, these components can be fabricated from Teflon or similar material.

Thus it is apparent that there has been provided, in accordance with the invention, an apparatus and process for cleaning work pieces that fully meets the needs set forth above. Although the invention has been described and illustrated with reference to specific illustrative embodiments, it is not intended that the invention be limited to these embodiments. Those of skill in the art will appreciate that many variations and modifications such as those enumerated below are possible without departing from the scope of the invention. For example, other materials, compatible with the selected cleaning fluids, can be used to fabricate the apparatus. For example, the cleaning pads can be formed from other spongy materials other than PVA or can be formed as bristled brushes rather than sponges. Other mechanisms can be used to accomplish the movement and rotation of the cleaning pads. And other configurations can be used for the work piece cleaning station and for the relative placement of the work piece cleaning station and the pad cleaning station. Accordingly, it is intended that all these and other such variations and modifications be included within the invention as defined by the appended claims.

What is claimed is:

1. Apparatus for cleaning a work piece comprising:
   a cleaning pad configured to clean a first surface of the work piece;
   a support stand configured to impart vertical positioning to the cleaning pad and to pivot the cleaning pad from a first work piece cleaning position to a second pad cleaning position;
   a drive motor configured to impart rotary motion to the cleaning pad;
   a pad cleaning bath positioned at the second pad cleaning position; and
   a beater bar positioned in the pad cleaning bath.

2. The apparatus of claim 1 wherein the pad cleaning bath comprises:
   a concave shaped container;
   a first orifice configured for ingress of fresh cleaning fluid to the container; and
   a second orifice configured for egress of used cleaning fluid from the container.

3. The apparatus of claim 2 further comprising an overflow opening in an edge of the container.

4. The apparatus of claim 2 wherein the beater bar is positioned at the bottom of the concave interior of the container.

5. The apparatus of claim 1 wherein pad cleaning bath comprises a concave shape and the beater bar comprises a structure upstanding from the interior of the concave shape.

6. The apparatus of claim 5 wherein the beater bar further comprises an aperture through which a cleaning fluid can be ejected.

7. The apparatus of claim 5 wherein the concave shaped pad cleaning bath has a substantially circular interior shape having a diameter and the beater bar has a length equal to more than half but less than all of the diameter.

8. The apparatus of claim 1 wherein the cleaning pad is substantially circular and the pad cleaning bath comprises a concave shape having a substantially circular interior having a diameter about 0.5 to about 2.0 centimeters greater than the diameter of the cleaning pad.

9. The apparatus of claim 1 wherein the beater bar comprises liquid knife.

10. The apparatus of claim 9 wherein the beater bar comprises an aperture through which a cleaning fluid can be ejected at a high pressure.

11. Apparatus for cleaning a plurality of work pieces, the apparatus comprising:
    a work piece cleaning station;
    a cleaning pad cleaning station;
    a cleaning fluid mechanism configured to deliver a cleaning fluid of predetermined composition to the work piece cleaning station and to the cleaning pad cleaning station; and a beater bar positioned in the cleaning pad cleaning station and configured to clean a cleaning pad when such cleaning pad is rotated against the beater bar.

12. Apparatus for cleaning a plurality of work pieces, the apparatus comprising:

a work piece cleaning station;

a cleaning pad cleaning station;

a beater bar positioned in the cleaning pad cleaning station;

a cleaning pad carrier configured to rotate and press a cleaning pad against a work piece positioned in the work piece cleaning station and, alternatively, against the beater bar.

13. The apparatus of claim 12 further comprising a cleaning fluid delivery mechanism configured to deliver a cleaning fluid of predetermined composition to the work piece cleaning station and to the cleaning pad cleaning station.

14. Apparatus for cleaning a work piece comprising:

a work piece cleaning station;

a cleaning pad cleaning station;

a work piece cleaning pad having a work piece cleaning surface, the cleaning pad movable between the work piece cleaning station and the cleaning pad cleaning station; and a beater bar positioned in the cleaning pad cleaning station against which the work piece cleaning surface of the cleaning pad can be rotated.

15. The apparatus of claim 14 wherein the beater bar comprises a rigid structure fixed to the cleaning pad cleaning station.

16. The apparatus of claim 14 wherein the beater bar comprises a liquid knife formed by a spray of cleaning fluid delivered through an aperture in the cleaning pad cleaning station.

17. The apparatus of claim 14 further comprising a cleaning fluid delivery mechanism for spraying a first cleaning fluid on a work piece positioned in the work piece cleaning station.

18. The apparatus of claim 17 further comprising a second cleaning fluid delivery mechanism for wetting the work piece cleaning surface of a cleaning pad positioned in the cleaning pad cleaning station with a second cleaning fluid.

19. The apparatus of claim 18 wherein the second cleaning fluid is of substantially the same composition as the first cleaning fluid.

20. The apparatus of claim 17 wherein the mechanism for spraying also delivers a cleaning fluid for wetting the work piece cleaning surface of a cleaning pad positioned in the cleaning pad cleaning station.

* * * * *